United States Patent
Ma et al.

(10) Patent No.: US 12,412,825 B2
(45) Date of Patent: Sep. 9, 2025

(54) SEMICONDUCTOR PACKAGE

(71) Applicant: CHIPBOND TECHNOLOGY CORPORATION, Hsinchu (TW)

(72) Inventors: Yu-Chen Ma, Kaohsiung (TW); Pei-Wen Wang, Taichung (TW); Hsin-Hao Huang, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 586 days.

(21) Appl. No.: 17/975,692

(22) Filed: Oct. 28, 2022

(65) Prior Publication Data

US 2023/0163061 A1 May 25, 2023

(30) Foreign Application Priority Data

Nov. 23, 2021 (TW) .................................. 110213895

(51) Int. Cl.
*H01L 23/498* (2006.01)
*H01L 23/00* (2006.01)

(52) U.S. Cl.
CPC .... *H01L 23/49838* (2013.01); *H01L 23/4985* (2013.01); *H01L 24/16* (2013.01); *H01L 24/32* (2013.01); *H01L 24/73* (2013.01); *H01L 2224/16227* (2013.01); *H01L 2224/26175* (2013.01); *H01L 2224/32225* (2013.01); *H01L 2224/73204* (2013.01)

(58) Field of Classification Search
CPC .......... H01L 23/49838; H01L 23/4985; H01L 24/16; H01L 24/32
See application file for complete search history.

(56) References Cited

U.S. PATENT DOCUMENTS

| | | | |
|---|---|---|---|
| 10,325,783 B2 * | 6/2019 | Munding | H01L 25/0657 |
| 2010/0038780 A1 * | 2/2010 | Daubenspeck | H10D 62/117 257/E23.129 |
| 2019/0103375 A1 * | 4/2019 | Huang | H01L 24/19 |

FOREIGN PATENT DOCUMENTS

| | | | |
|---|---|---|---|
| JP | 9-232474 A | 9/1997 | |
| JP | 2006-13030 A | 1/2006 | |
| JP | 2007-173738 A | 7/2007 | |
| WO | WO-2009050891 A1 * | 4/2009 | H01L 21/563 |

OTHER PUBLICATIONS

Korean Office Action mailed Feb. 22, 2024 for Korean utility model Application No. 20-2022-0002544, 7 pages.

* cited by examiner

*Primary Examiner* — Errol V Fernandes
(74) *Attorney, Agent, or Firm* — Demian K. Jackson; Jackson IPG PLLC

(57) ABSTRACT

In a semiconductor package, flow guiding strips are provided on a guiding area of a flexible substrate to separate a chip and the flexible substrate such that a filling material flowing between the chip and the flexible substrate can squeeze out the air between the chip and the flexible substrate to improve the reliability of the semiconductor package.

18 Claims, 3 Drawing Sheets

SEMICONDUCTOR PACKAGE

FIELD OF THE INVENTION

This invention relates to a semiconductor package, and more particularly to a semiconductor package with an improved reliability by helping a filling material to squeeze out air between chip and flexible substrate.

BACKGROUND OF THE INVENTION

In conventional technology, conductive pads are arranged around a chip's surface and the chip is electrically connected to a substrate by bumps disposed on the conductive pads. In order to enhance the bonding strength of the chip to the substrate and prevent oxidation of the bumps, an underfill is dispensed along the chip's edge to flow by capillarity and fill the space between the chip and the substrate. However, an area without bumps between the chip and the substrate may slow down the flow of the underfill, fail to squeeze out the air between the chip and the substrate and lead the air to be covered by the underfill between the chip and the substrate. Furthermore, the area without the bumps may cause uncontrollable deformation of the substrate, such as warpage. While the deformed substrate contacts the chip, the underfill may be blocked to cover the air between the chip and the substrate and reduce filling rate and package reliability.

SUMMARY

One object of the present invention is to provide a semiconductor package which has flow guiding strips disposed on a guiding area of a flexible substrate. Because of the flow guiding strips, a filling material flowing between a chip and the flexible substrate can squeeze out the air between the chip and the flexible substrate to improve reliability of the semiconductor package.

A semiconductor package of the present invention includes a chip, bumps and a flexible substrate. The chip includes conductive pads which are visible from the chip's first surface. A first area and a second area are defined on the first surface, the first area is located between an edge of the first surface and the second area, the conductive pads are arranged on the first area. The bumps are disposed on the conductive pads respectively. The flexible substrate includes conductive lines and flow guiding strips. A chip mounting area, a guiding area and a wire area are defined on a second surface of the flexible substrate, the guiding area is located inside the chip mounting area. Each of the conductive lines includes an inner lead and a wire which are connected with each other. Along a first direction, the inner lead is located on the chip mounting area, the wire is located on the wire area, and the flow guiding strips are located on the guiding area. The flow guiding strips are extended toward the inner lead of each of the conductive lines along the first direction and not connected to the conductive lines. A first guiding channel is located between the adjacent flow guiding strips along the first direction, a second guiding channel is located between the adjacent flow guiding strips along a second direction which intersects the first direction, and the second guiding channel is communicated with the first guiding channel. The chip is mounted on the chip mounting area and bonded to the inner lead of each of the conductive lines by the bumps, the first surface of the chip is faced toward the second surface of the flexible substrate. The second area is located above the guiding area, the flow guiding strips are located between the second area and the guiding area and provided to separate the first surface of the chip and the second surface of the flexible substrate.

Owing to the flow guiding strips disposed on the guiding area and the first and second guiding channels located between the adjacent flow guiding strips, the flowing filling material can squeeze out the air between the chip and the flexible substrate to increase filling rate of the filling material.

DETAILED DESCRIPTION OF THE INVENTION

Figure 1:
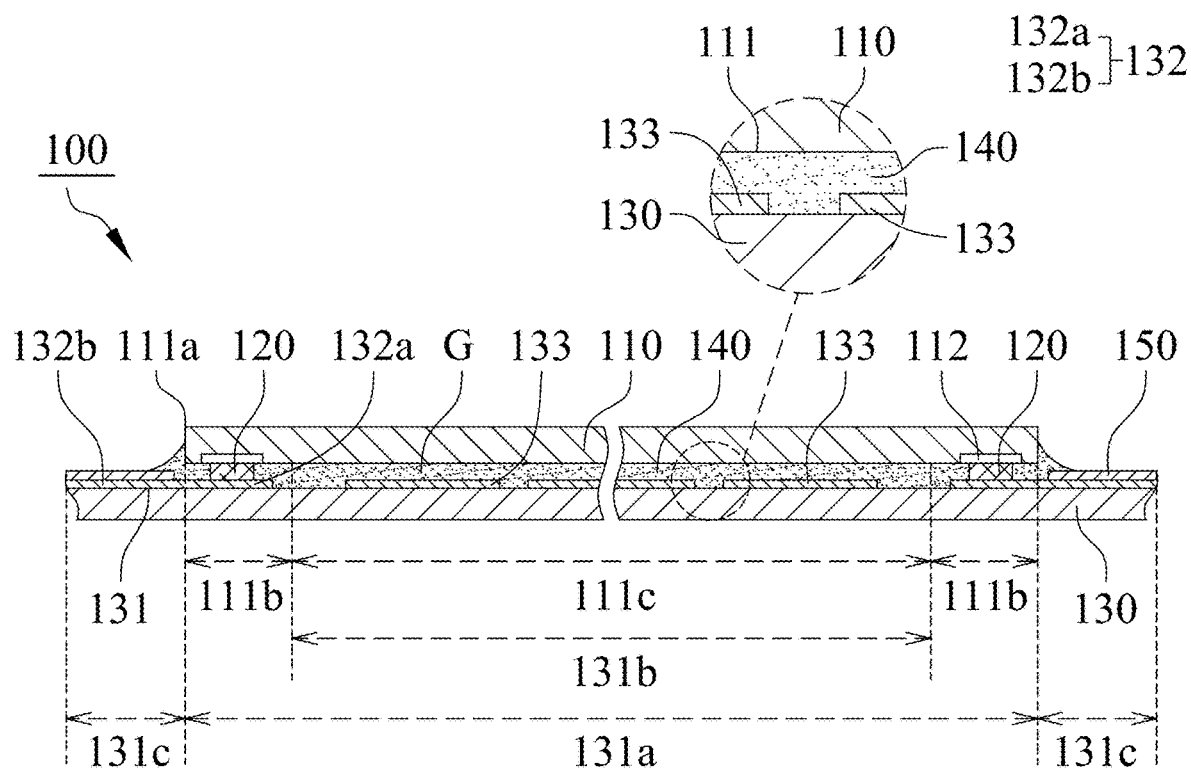
FIG. 1 is a cross-section view diagram illustrating a semiconductor package in accordance with one embodiment of the present invention.
Figure 2:
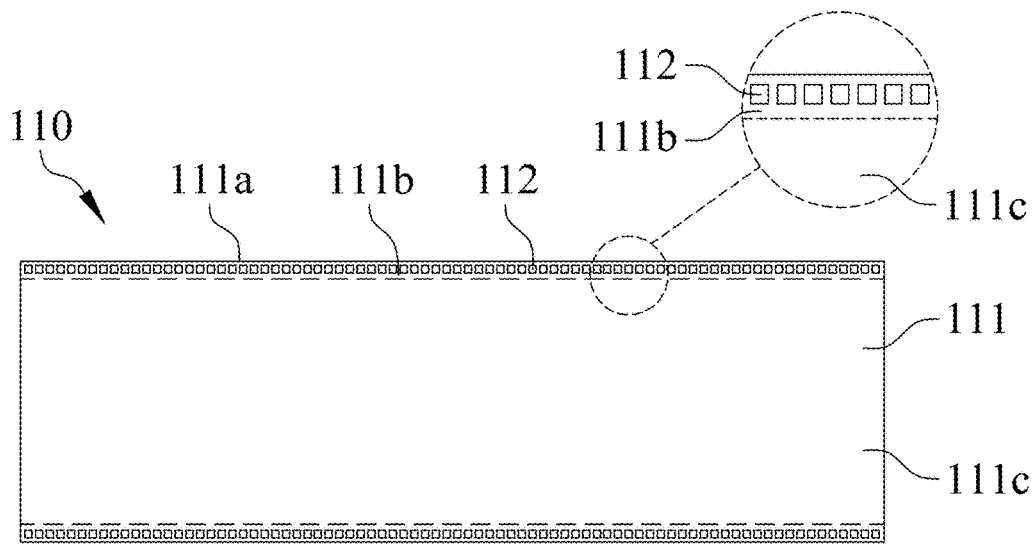
FIG. 2 is a top view diagram illustrating a chip of a semiconductor package in accordance with one embodiment of the present invention.
Figure 3:
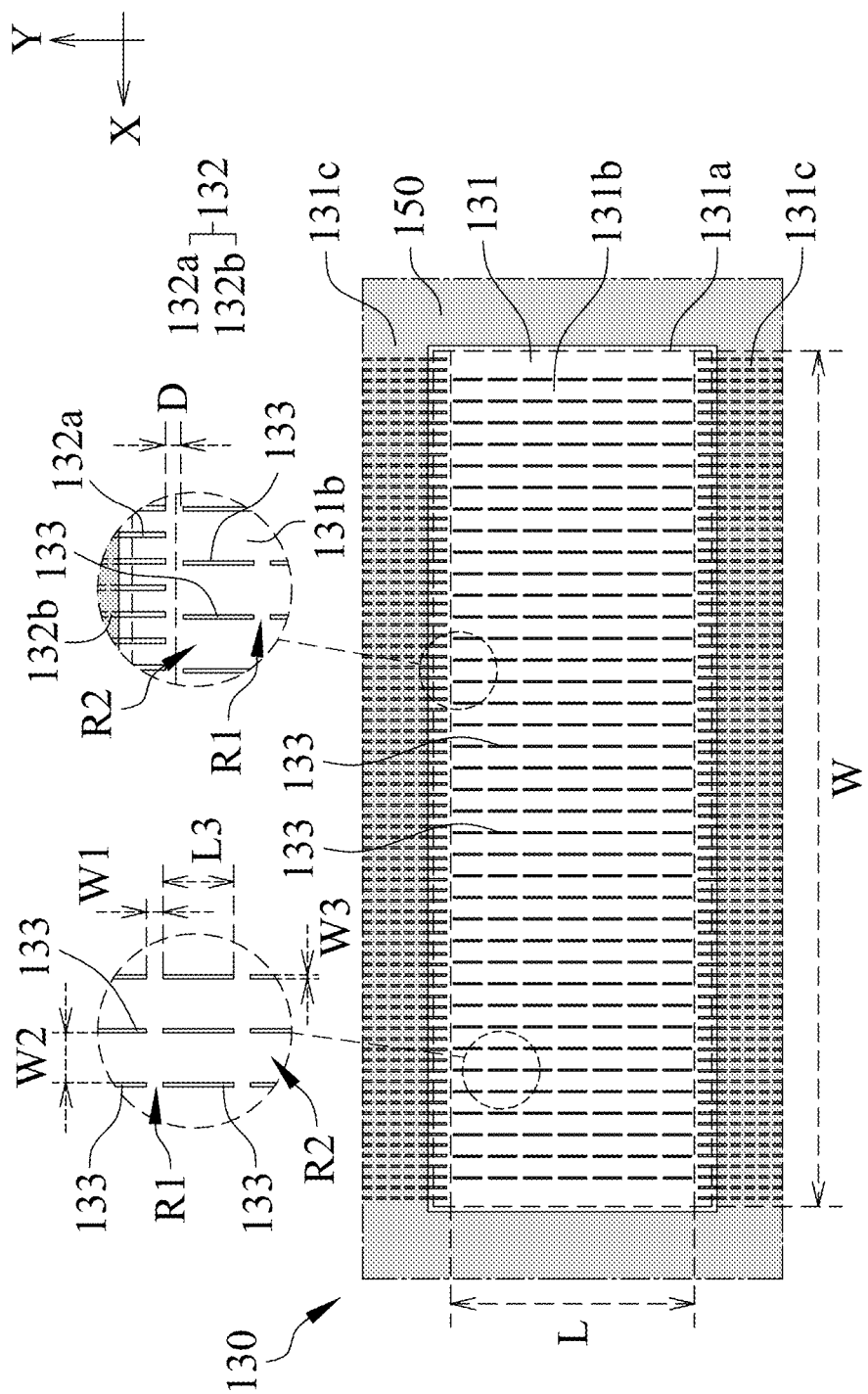
FIG. 3 is a top view diagram illustrating a part of a flexible substrate of a semiconductor package in accordance with one embodiment of the present invention.

With reference to FIGS. 1 to 3, a semiconductor package 100 in accordance with one embodiment of the present invention includes a chip 110, a plurality of bumps 120, a flexible substrate 130 and a filling material 140. The chip 110 includes a first surface 111 and a plurality of conductive pads 112 which are visible from the first surface 111. A first area 111b and a second area 111c are defined on the first surface 111, the first area 111b is located between an edge 111a of the first surface 111 and the second area 111c. The conductive pads 112 are located on the first area 111b, and the bumps 120 are disposed on the conductive pads 112, respectively.

With reference to FIGS. 1 and 3, the flexible substrate 130 includes a second surface 131, a plurality of conductive lines 132 and a plurality of flow guiding strips 133. A chip mounting area 131a, a guiding area 131b and a wire area 131c are defined on the second surface 131, the guiding area 131b is located inside the chip mounting area 131a. Each of the conductive lines 132 includes an inner lead 132a, a wire 132b and an outer lead (not shown), the inner lead 132a and the outer lead are respectively located on both ends of the wire 132b and connected to the wire 132b. Preferably, the flexible substrate 130 further includes a soler resist layer 150 used to cover the second surface 131 of the flexible substrate 130 and the wire 132b of each of conductive lines 132. The inner lead 132a and the outer lead of each of the conductive lines 132, the guiding area 131b and the chip mounting area 131a on the second surface 131 of the flexible substrate 130 are not covered by the solder resist layer 150.

With reference to FIG. 3, the guiding area 131b has a length L greater than or equal to 300 µm along a first direction Y and has a width W greater than or equal to 300 µm along a second direction X which intersects the first direction Y. Preferably the width W of the guiding area 131b is greater than 500 µm.

With reference to FIGS. 1 and 3, the inner leads 132a of the conductive lines 132 are located on the chip mounting area 131a and close to the guiding area 131b, the wires 132b of the conductive lines 132 are located on the wire area 131c, the flow guiding strips 133 are located on the guiding area 131b and extended toward the inner leads 132a of the conductive lines 132 along the first direction Y, but the flow guiding strips 133 are not connected to the conductive lines 132. Preferably, there is a distance D between each of the flow guiding strips 133 and the inner lead 132a of each of the conductive lines 132, the distance D is greater than or equal to 50 μm and is less than or equal to 100 μm along the first direction Y (50 μm≤D≤100 μm). In this embodiment, the flow guiding strips 133 and the conductive lines 132 are made of the same material owing to they are formed together after patterning a metal layer. In other embodiments, the flow guiding strips 133 and the solder resist layer 150 are made of the same material and formed by screen printing.

With reference to FIG. 3, each of the flow guiding strips 133 has a length L3 greater than or equal to 100 μm and less than or equal to 300 μm along the first direction Y (100 μm≤L3≤300 μm), and each of the flow guiding strips 133 has a width W3 greater than or equal to 7 μm and less than or equal to 30 μm along the second direction X (7 μm≤W3≤30 μm). Along the first direction Y, a first guiding channel R1 exists between the two adjacent flow guiding strips 133 and it has a first width W1 greater than or equal to 50 μm and less than or equal to 100 μm (50 μm≤W1≤100 μm). And along the second direction X, a second guiding channel R2 exists between the two adjacent flow guiding strips 133 and it has a second width W2 greater than or equal to 100 μm and less than or equal to 500 μm (100 μm≤W2≤500 μm). The second guiding channel R2 is communicated with the first guiding channel R1.

With reference to FIGS. 1 to 3, the chip 110 is mounted on the chip mounting area 131a and its first surface 111 faces toward the second surface 131 of the flexible substrate 130. The chip 110 is bonded to the inner leads 132a of the conductive lines 132 by the bumps 120. After bonding, the second area 111c of the first surface 111 of the chip 110 is located above the guiding area 131b of the second surface 131 of the flexible substrate 130, and the flow guiding strips 133 are located between the second area 111c and the guiding area 131b. The flow guiding strips 133 are provided to separate the first surface 111 of the chip 110 and the second surface 131 of the flexible substrate 130. In this embodiment, a gap G exists between the first surface 111 of the chip 110 and each of the flow guiding strips 133. While dispensing the filling material 140 along the edge of the chip 110, the filling material 140 can flow by capillarity to fill the space between the first surface 111 of the chip 110 and the second surface 131 of the flexible substrate 130. The filling material 140 is guided by the flow guiding strips 133, the first guiding channel R1 and the second guiding channel R2 to flow through the guiding area 131b and squeeze the air between the chip 110 and the flexible substrate 130 out of the chip mounting area 131a. As a result, the filling material 140 can flow in the first guiding channel R1, the second guiding channel R2 and the gap G smoothly to increase filling rate.

With reference to FIG. 1, while the flexible substrate 130 has a deformation due to material property or temperature variation, the flow guiding strips 133 on the flexible substrate 130 may contact the first surface 111 of the chip 110 so as to prevent the second surface 131 of the flexible substrate 130 from contacting the first surface 111 of the chip 110, thus the flow of the filling material 140 between the chip 110 and the flexible substrate 130 will not be blocked. The filling material 140 can smoothly fill the space between the first surface 111 of the chip 110 and the second surface 131 of the flexible substrate 130, squeeze out the air between the chip 110 and the flexible substrate 130 and fill in the first guiding channel R1 and the second guiding channel R2, consequently, the reliability of the semiconductor package 100 can be improved.

Figure 4:
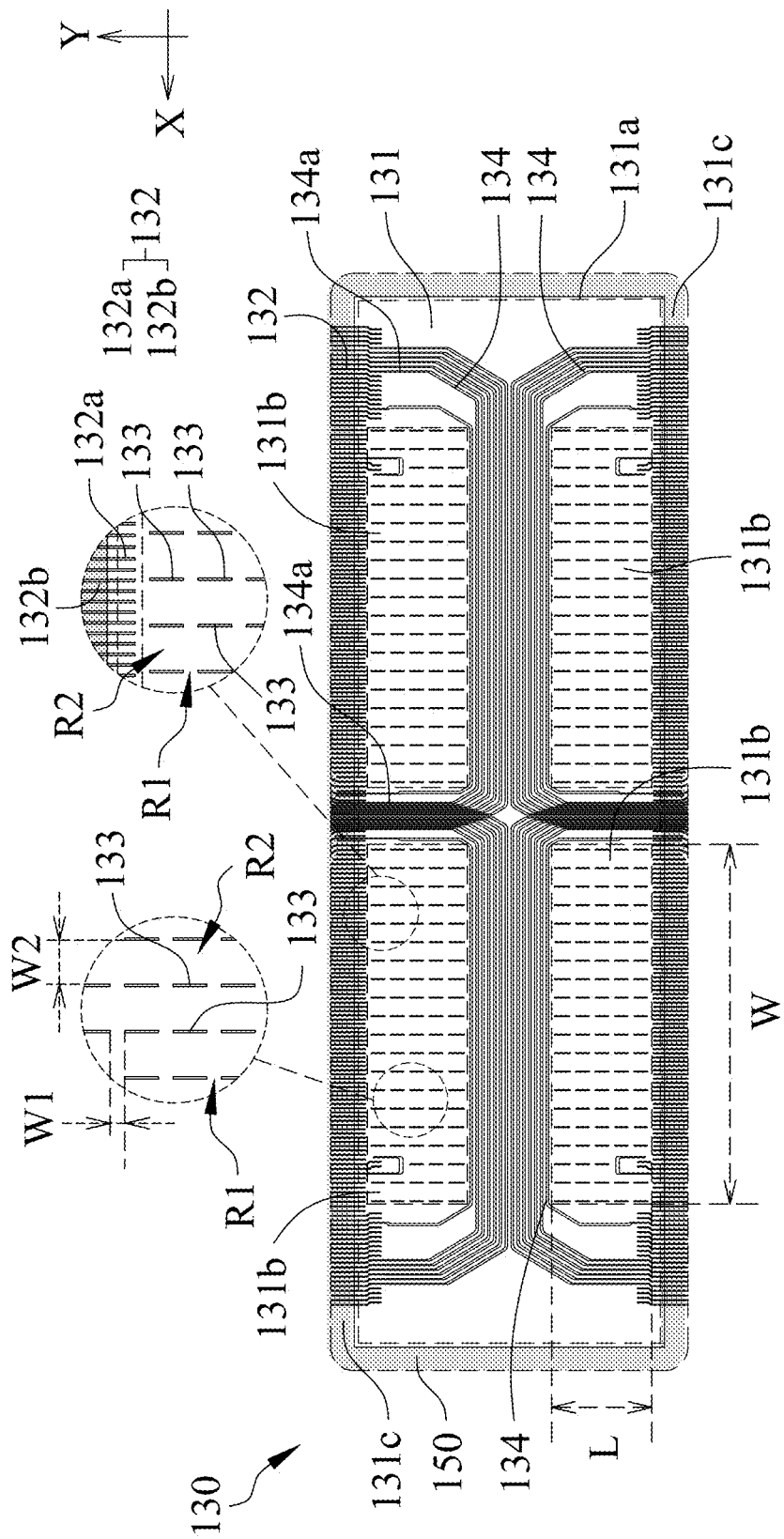
FIG. 4 is a top view diagram illustrating a part of a flexible substrate of a semiconductor package in accordance with another embodiment of the present invention.

FIG. 4 shows another embodiment of the present invention. In this embodiment, the flexible substrate 130 further includes at least one connective line 134 which is located on the chip mounting area 131a, both ends 134a of the conductive line 134 are used to bridge two of the conductive lines 132. The connective line 134 and the inner leads 132a of the conductive lines 132 surround the guiding area 131b. While dispensing the filling material 140 along the edge of the chip 110, the filling material 140 can flow by capillarity to fill the space between the first surface 111 of the chip 110 and the second surface 131 of the flexible substrate 130. By the guiding of the flow guiding strips 133, the first guiding channel R1 and the second guiding channel R2, the filling material 140 can flow through the guiding area 131b to squeeze the air between the chip 110 and the flexible substrate 130 out of the chip mounting area 131a, fill in the first guiding channel R1 and the second guiding channel R2 and cover the connective line 134 to enhance the reliability of the semiconductor package 100.

Because of the flow guiding strips 133 and the first and second guiding channels R1 and R2 located between the two adjacent flow guiding strips 133, the filling material 140 can squeeze out the air between the chip 110 and the flexible substrate 130 and smoothly fill the space between the chip 110 and the flexible substrate 130 to increase filling rate. Moreover, the flow guiding strips 133 are provided to separate the first surface 111 of the chip 110 and the second surface 131 of the flexible substrate 130 such that the contacting between the first surface 111 of the chip 110 and the second surface 131 of the flexible substrate 130 and the flow blocking of the fill material 140 between the chip 110 and the flexible substrate 130 are preventable.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A semiconductor package comprising:
  a chip including a first surface and a plurality of conductive pads which are visible from the first surface, a first area and a second area are defined on the first surface, the first area is located between an edge of the first surface and the second area, the plurality of conductive pads are located on the first area;
  a plurality of bumps each disposed on one of the plurality of conductive pads; and
  a flexible substrate including a second surface, a plurality of conductive lines and a plurality of flow guiding strips, a chip mounting area, a guiding area and a wire area are defined on the second surface, the guiding area is located inside the chip mounting area, each of the plurality of conductive lines includes an inner lead and a wire which are connected with each other, the inner lead, the wire and the plurality of flow guiding strips are disposed on the chip mounting area, the wire area and the guiding area respectively along a first direction, the plurality of flow guiding strips are arranged to extend toward the inner lead of the plurality of conductive lines along the first direction and are not connected to the plurality of conductive lines, a first guiding channel is located between the adjacent flow guiding strips along the first direction and a second guiding channel is located between the adjacent flow guiding strips along a second direction which intersects the first direction, the second guiding channel is communicated with the first guiding channel, the chip is mounted on the chip mounting area and bonded to the inner lead of the plurality of conductive lines by the plurality of bumps, the first surface of the chip faces toward the second surface of the flexible substrate, the second area of the first surface of the chip is located above the guiding area of the second surface of the flexible substrate, the plurality of flow guiding strips are located between the second area and the guiding area and configured to separate the first surface of the chip and the second surface of the flexible substrate.

2. The semiconductor package in accordance with claim 1, wherein the flexible substrate includes at least one connective line which is located on the chip mounting area, both ends of the at least one connective line are configured to bridge two of the plurality of conductive lines, the at least one connective line and the inner lead of the plurality of conductive lines surround the guiding area.

3. The semiconductor package in accordance with claim 1 further comprising a filling material, wherein the plurality of flow guiding strips are configured to contact the first surface of the chip, the filling material is configured to be filled between the first surface of the chip and the second surface of the flexible substrate and filled in the first guiding channel and the second guiding channel.

4. The semiconductor package in accordance with claim 2 further comprising a filling material, wherein the plurality of flow guiding strips are configured to contact the first surface of the chip, the filling material is configured to be filled between the first surface of the chip and the second surface of the flexible substrate and filled in the first guiding channel and the second guiding channel.

5. The semiconductor package in accordance with claim 1 further comprising a filling material, wherein there is a gap between the first surface of the chip and each of the plurality of flow guiding strips, the filling material is configured to be filled between the first surface of the chip and the second surface of the flexible substrate and filled in the first guiding channel, the second guiding channel and the gap.

6. The semiconductor package in accordance with claim 2 further comprising a filling material, wherein there is a gap between the first surface of the chip and each of the plurality of flow guiding strips, the filling material is configured to be filled between the first surface of the chip and the second surface of the flexible substrate and filled in the first guiding channel, the second guiding channel and the gap.

7. The semiconductor package in accordance with claim 1, wherein the guiding area has a length along the first direction, the length is greater than or equal to 300 μm.

8. The semiconductor package in accordance with claim 7, wherein the first guiding channel has a first width along the first direction, the first width is greater than or equal to 50 μm and less than or equal to 100 μm.

9. The semiconductor package in accordance with claim 2, wherein the guiding area has a length along the first direction, the length is greater than or equal to 300 μm.

10. The semiconductor package in accordance with claim 9, wherein the first guiding channel has a first width along the first direction, the first width is greater than or equal to 50 μm and less than or equal to 100 μm.

11. The semiconductor package in accordance with claim 1, wherein the guiding area has a width along the second direction, the width is greater than or equal to 300 μm.

12. The semiconductor package in accordance with claim 11, wherein the width of the guiding area along the second direction is greater than 500 μm, the second guiding channel has a second width along the second direction, the second width is greater than or equal to 100 μm and less than or equal to 500 μm.

13. The semiconductor package in accordance with claim 2, wherein the guiding area has a width along the second direction, the width is greater than or equal to 300 μm.

14. The semiconductor package in accordance with claim 13, wherein the width of the guiding area along the second direction is greater than 500 μm, the second guiding channel has a second width along the second direction, the second width is greater than or equal to 100 μm and less than or equal to 500 μm.

15. The semiconductor package in accordance with claim 1, wherein each of the plurality of flow guiding strips has a length along the first direction, the length is greater than or equal to 100 μm and less than or equal to 300 jam, each of the plurality of flow guiding strips has a width along the second direction, the width is greater than or equal to 7 μm and less than or equal to 30 μm.

16. The semiconductor package in accordance with claim 1, wherein a distance between each of the plurality of flow guiding strips and the inner lead of each of the plurality of conductive lines along the first direction is greater than or equal to 50 μm and less than or equal to 100 μm.

17. The semiconductor package in accordance with claim 1, wherein the plurality of the flow guiding strips and the plurality of conductive lines are made of the same material.

18. The semiconductor package in accordance with claim 1, wherein the flexible substrate further includes a solder resist layer, the solder resist layer is configured to cover the second surface of the flexible substrate and the wire and not cover the inner lead, the guiding area and the chip mounting area, the plurality of flow guiding strips and the solder resist layer are made of the same material.

* * * * *